(12) United States Patent
Necula et al.

(10) Patent No.: US 12,514,002 B2
(45) Date of Patent: Dec. 30, 2025

(54) THIN FILM PHOTOVOLTAIC DEVICES AND MANUFACTURING METHODS

(71) Applicants: Robert Necula, Montreal (CA); Riad Nechache, Montreal (CA)

(72) Inventors: Robert Necula, Montreal (CA); Riad Nechache, Montreal (CA)

( * ) Notice: Subject to any disclaimer, the term of this patent is extended or adjusted under 35 U.S.C. 154(b) by 0 days.

(21) Appl. No.: 18/710,424

(22) PCT Filed: Nov. 14, 2022

(86) PCT No.: PCT/CA2022/051673
§ 371 (c)(1),
(2) Date: May 15, 2024

(87) PCT Pub. No.: WO2023/082016
PCT Pub. Date: May 19, 2023

(65) Prior Publication Data
US 2025/0006854 A1    Jan. 2, 2025

Related U.S. Application Data

(60) Provisional application No. 63/279,254, filed on Nov. 15, 2021.

(51) Int. Cl.
*H10F 19/33* (2025.01)
*B23K 26/362* (2014.01)
*H10F 71/00* (2025.01)

(52) U.S. Cl.
CPC .......... *H10F 19/33* (2025.01); *B23K 26/362* (2013.01); *H10F 71/137* (2025.01)

(58) Field of Classification Search
CPC ...... H10F 19/33; H10F 71/137; B23K 26/362
See application file for complete search history.

(56) References Cited

U.S. PATENT DOCUMENTS

| | | | |
|---|---|---|---|
| 4,419,530 A | 12/1983 | Nath | |
| 4,502,225 A * | 3/1985 | Lin | ........................ C03C 17/002 33/18.1 |
| 4,589,194 A * | 5/1986 | Roy | ......................... H10F 19/33 136/258 |
| 8,263,494 B2 | 9/2012 | Patterson | |
| 8,563,351 B2 | 10/2013 | Tu et al. | |

(Continued)

OTHER PUBLICATIONS

Meroni (Year: 2020).*
Qiu Supplemental (Year: 2016).*
Qiu (Year: 2016).*

*Primary Examiner* — Sadie White
(74) *Attorney, Agent, or Firm* — Rosenberg, Klein & Lee

(57) ABSTRACT

Thin film devices such as solar cells are typically patterned on substrates as thin films requiring that the devices be electrically isolated when arrays are formed and/or be mechanically separated for packaging. With the development of thin film processes based upon perovskite inks then large area substrates can be implemented. Further, such perovskite inks and their low temperature processing allow them to employ low temperature flexible and/or conformal substrates such as polymeric substrates for example. Accordingly, a requirement exists for electrical isolating and/or mechanically isolating thin film devices with different physical layer structures, different geometries etc. on a wide range of substrates.

8 Claims, 12 Drawing Sheets

(56) References Cited

U.S. PATENT DOCUMENTS

| | | | |
|---|---|---|---|
| 2005/0223570 A1* | 10/2005 | Yonezawa | B28D 5/0064 |
| | | | 33/18.1 |
| 2007/0163646 A1* | 7/2007 | Kushiya | H10F 10/167 |
| | | | 136/264 |
| 2010/0009496 A1* | 1/2010 | Grundmueller | B23K 26/0006 |
| | | | 438/57 |
| 2015/0004734 A1* | 1/2015 | Chen | H10F 19/33 |
| | | | 438/57 |
| 2018/0040754 A1* | 2/2018 | Higuchi | H10K 71/621 |

* cited by examiner

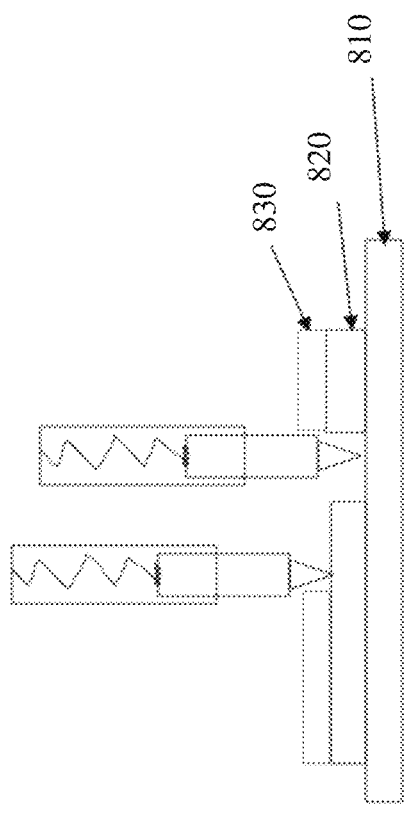
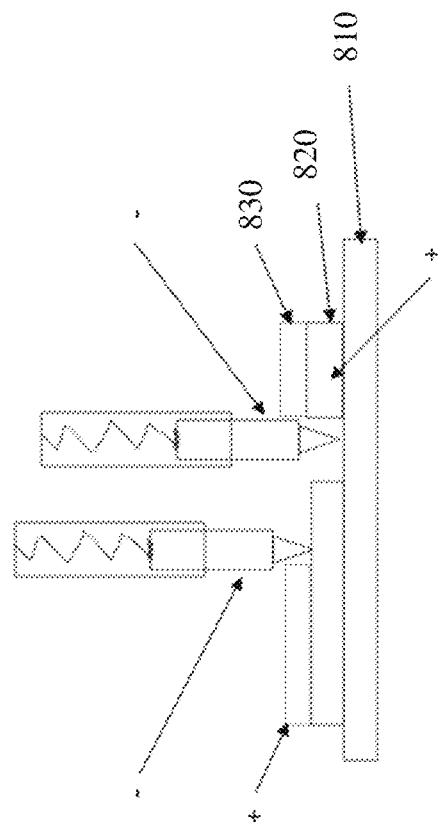
Figure 8
Figure 9

THIN FILM PHOTOVOLTAIC DEVICES AND MANUFACTURING METHODS

CROSS-REFERENCE TO RELATED APPLICATIONS

This patent application claims the benefit of priority as a 371 National Phase Entry application of PCT/CA2022/051673 filed Nov. 14, 2022; which itself claims the benefit of priority from U.S. Provisional Patent Application 63/279,254 filed Nov. 15, 2021; the entire contents of each being incorporated herein by reference.

FIELD OF THE INVENTION

This patent application relates to scribing and more particularly to techniques and processes for scribing thin-film photovoltaic devices.

BACKGROUND OF THE INVENTION

Thin film devices such as optical displays, light emitters, photodiodes, and solar cells are typically patterned on substrates as thin films requiring that the devices be electrically isolated when arrays are formed and/or be mechanically separated for packaging. With solar cells particularly and the development of thin film processes based upon perovskite inks then large area substrates can be implemented. Further, such perovskite inks and their low temperature processing allow them to employ low temperature flexible and/or conformal substrates such as polymeric substrates for example.

Accordingly, a requirement exists for electrical isolating and/or mechanically isolating thin film devices with different physical layer structures, different geometries etc. on a wide range of substrates.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to nanoparticles and more particularly to methods of manufacturing simple and complex nanoparticles using ablation.

In accordance with an embodiment of the invention there is provided a method of fabricating a photovoltaic device comprising:
  providing a structure comprising a substrate and a set of layers on one side of the substrate comprising a semiconductor material, an upper electrical contact to the semiconductor material and a lower electrical contact to the semiconductor material; and
  scribing a set of scribe lines; wherein
  each scribe line of the set of scribe lines is formed within a defined subset of the set of layers; and
  the set of scribe lines generate a series of electrically isolated adjacent photovoltaic cells upon the substrate which are subsequently electrically connected in a predetermined configuration through a subsequent manufacturing process to form the photovoltaic device.

In accordance with an embodiment of the invention there is provided a photovoltaic device comprising:
  a structure comprising a substrate and a set of layers on one side of the substrate comprising a semiconductor material, an upper electrical contact to the semiconductor material and a lower electrical contact to the semiconductor material;
  a set of scribe lines; wherein
  each scribe line of the set of scribe lines is formed within a defined subset of the set of layers; and
  the set of scribe lines generate a series of electrically isolated adjacent photovoltaic cells upon the substrate which are subsequently electrically connected in a predetermined configuration through a subsequent manufacturing process to form the photovoltaic device.

In accordance with an embodiment of the invention there is provided a system comprising:
  scriber comprising a tip;
  a load cell to which the scriber is attached;
  an actuator for moving the load cell and scriber relative to a surface of a substrate; and
  a positioning system to which the actuator is attached; wherein
  the actuator and positioning system position the tip of the scriber with respect to a set of layers formed upon a substrate;
  the actuator positions the tip of the scriber into contact with a defined layer of the set of layers; and
  the positioning system moves the substrate in order to scribe one or more layers of the stack of layers above the defined layer within which the tip of the scriber is in contact with.

In accordance with an embodiment of the invention there is provided a method of scribing a substrate comprising:
  providing a scriber comprising a tip;
  providing a load cell to which the scriber is attached;
  providing an actuator for moving the load cell and scriber relative to a surface of the substrate; and
  providing a positioning system to which the actuator is attached; wherein
  the actuator and positioning system position the tip of the scriber with respect to a set of layers formed upon a substrate;
  the actuator positions the tip of the scriber into contact with a defined layer of the set of layers; and
  the positioning system moves the substrate in order to scribe one or more layers of the stack of layers above the defined layer within which the tip of the scriber is in contact with.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 8 depicts a schematic of scribing sequential layers with systems and scribing tips according to embodiments of the invention;

FIGS. 9 and 10 depict schematic of electrical measurement acquisitions during the scribing processes;

DETAILED DESCRIPTION

Figure 1:
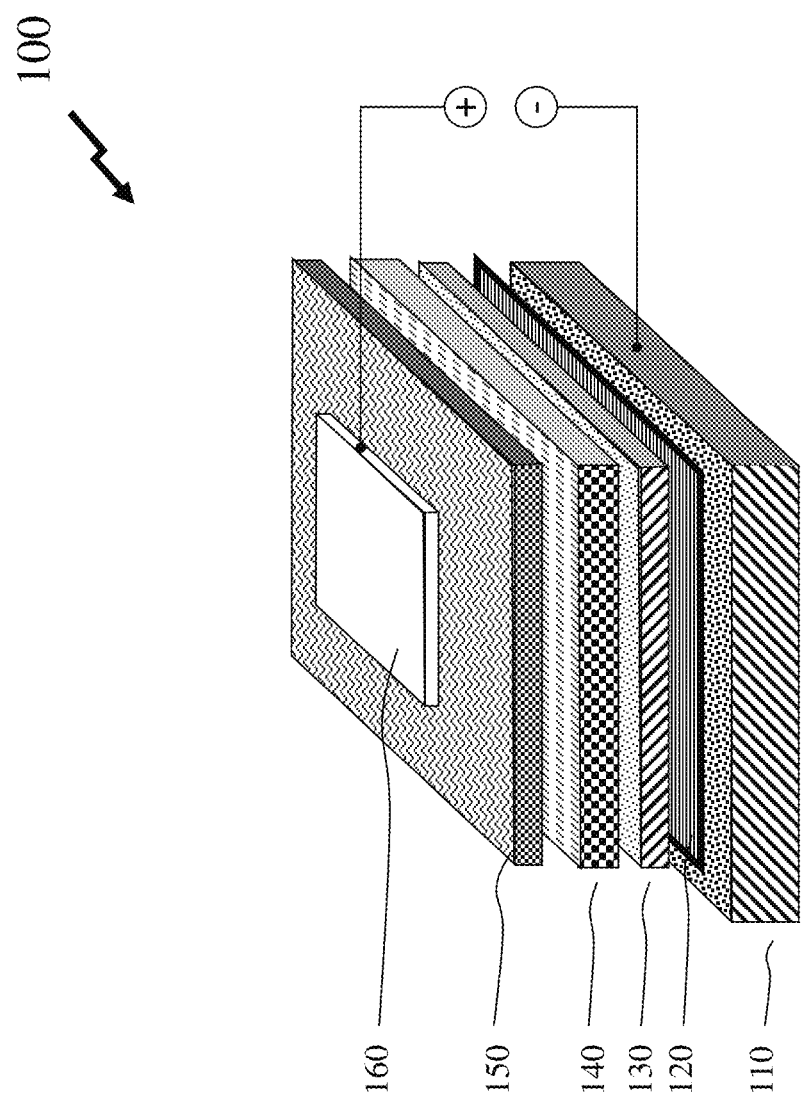
FIG. 1 depicts a schematic representation of a multilayer heterostructure architecture of an exemplary perovskite based solar cell exploiting organic-inorganic halide perovskite (OIHP) materials as may be processed by a systems according to embodiments of the invention.

The present invention is direct to nanoparticles and more particularly to methods of manufacturing simple and complex nanoparticles using ablation.

The ensuing description provides representative embodiment(s) only, and is not intended to limit the scope, applicability or configuration of the disclosure. Rather, the ensuing description of the embodiment(s) will provide those skilled in the art with an enabling description for implementing an embodiment or embodiments of the invention. It being understood that various changes can be made in the function and arrangement of elements without departing from the spirit and scope as set forth in the appended claims. Accordingly, an embodiment is an example or implementation of the inventions and not the sole implementation. Various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention can also be implemented in a single embodiment or any combination of embodiments.

Reference in the specification to "one embodiment," "an embodiment," "some embodiments" or "other embodiments" means that a particular feature, structure, or characteristic described in connection with the embodiments is included in at least one embodiment, but not necessarily all embodiments, of the inventions. The phraseology and terminology employed herein is not to be construed as limiting but is for descriptive purposes only. It is to be understood that where the claims or specification refer to "a" or "an" element, such reference is not to be construed as there being only one of that element. It is to be understood that where the specification states that a component feature, structure, or characteristic "may," "might," "can" or "could" be included, that particular component, feature, structure, or characteristic is not required to be included.

Reference to terms such as "left," "right," "top," "bottom," "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users.

Reference to terms "including," "comprising," "consisting" and grammatical variants thereof do not preclude the addition of one or more components, features, steps, integers or groups thereof and that the terms are not to be construed as specifying components, features, steps or integers. Likewise, the phrase "consisting essentially of," and grammatical variants thereof, when used herein is not to be construed as excluding additional components, steps, features integers or groups thereof but rather that the additional features, integers, steps, components or groups thereof do not materially alter the basic and novel characteristics of the claimed composition, device or method. If the specification or claims refer to "an additional" element, that does not preclude there being more than one of the additional element.

A "metal" as used herein and throughout this disclosure refers to, but is not limited to, a material having good electrical and thermal conductivity. Metals are generally malleable, fusible, and ductile. Metals as used herein may refer to elements, such as gold, silver, copper, aluminum, iron, titanium, rhodium, etc.

An "alloy" as used herein and throughout this disclosure refers to, but is not limited to, is an admixture of metals, or a metal combined with one or more other elements. An alloy may be a solid solution of metal elements having a single phase (i.e., where all metallic grains (crystals) are of the same composition) or a mixture of metallic phases (two or more solutions, forming a microstructure of different crystals within the metal). An alloy may also refer to an intermetallic compound with a defined stoichiometry and crystal structure.

A "ceramic" as used herein and throughout this disclosure may refer to, but is not limited to, an inorganic, nonmetallic solid material comprising metal, non-metal or metalloid atoms primarily held in ionic and covalent bonds. Such ceramics may be crystalline materials such as oxide, nitride or carbide materials, elements such as carbon or silicon, and non-crystalline.

An "insulator" as used herein and throughout this disclosure may refer to, but is not limited to, an electrical insulator and/or a thermal insulator. An electrical insulator being a material or materials whose internal electric charges do not flow freely, and therefore make it difficult to conduct an electric current under the influence of an electric field.

A "conductor" as used herein and throughout this disclosure may refer to, but is not limited to, an electrical conductor and/or a thermal conductor. An electrical conductor being a material or materials allowing the flow of charge (electrical current) in one or more directions under the influence of an electric field. A thermal conductor being a material or materials allowing the transfer of internal energy by the microscopic collisions of particles and/or movement of electrons within the material(s).

A "semiconductor material" or "semiconductor" as used herein and throughout this disclosure may refer to, but is not limited to, a material having an electrical conductivity value falling between that of a conductor and an insulator which falls as its temperature rises. Its conducting properties may be altered by introducing impurities ("doping") into the crystal structure. When two differently doped regions exist in the same crystal, a semiconductor junction is created wherein the behavior of charge carriers, which include electrons, ions and electron holes, at these junctions vary according to the electrical bias thereby allowing such junctions to function as diodes, transistors and alike. Some examples of semiconductors or semiconductors include silicon, germanium, gallium arsenide, indium phosphide, and elements near the so-called "metalloid staircase" within the periodic table.

A "polymer" as used herein may refer to, but is not limited to, is a large molecule, or macromolecule, composed of many repeated subunits. Such polymers may be natural and synthetic and typically created via polymerization of multiple monomers. Polymers through their large molecular mass may provide unique physical properties, including toughness, viscoelasticity, and a tendency to form glasses and semi-crystalline structures rather than crystals.

Organic-inorganic halide perovskite (OIHP) materials of general formula ABX3 (A=cation/s such as methylammonium (MA) or formadiminum (FA) or Cs or combinations thereof, B=Pb, and X=I, Br, Cl or combinations thereof) materials have recently attracted great interest due to their promising material properties, simple solution processability and low material cost which makes them compatible to the requirements in the direction of large area coatings. Further, their high photon absorption, carrier mobilities, and tunable band gap, between 1.5 eV and 2.2 eV, make them particularly advantageous for applications such as optical displays, light emitting diodes (LEDs), photovoltaic (PV) cells (e.g., solar cells, tandem solar cells) and photodetectors.

Whilst the embodiments of the invention are described with respect to solar cells the embodiments of the invention may be employed within the fabrication of other devices, including but not limited those identified above where these devices require specific layers to be arranged in a particular manner upon the surface of the device with different scribing patterns and scribing sequences together with different combinations of materials to be scribed through in each scribing step.

As described within World Intellectual Property Office patent publication WO/2020/248,063 entitled "Doped Mixed Cation Perovskite Materials and Devices Exploiting Same" such OIHP materials can be manufactured, be stable and processable under ambient atmosphere thereby allowing a reduction in processing and coating complexity and thereby cost of OIHP devices.

Referring to FIG. 1, there is depicted schematically a full-stack multilayered structure of an exemplary three-dimensional (3D) perovskite solar cell (PSC) 100 showing each layer and junction. PSC 100 comprising a stacked sequence of:
  Fluorine doped Tin Oxide (FTO) 110 glass;
  Lower charge extracting structure comprising:
    Electron Transport Layer (ETL) 120;
    Semiconductor Material 130 (e.g., mesoporous titanium dioxide, MP-$TiO_2$);
  Perovskite semiconductor material (PE) 140;
  Upper charge extracting structure comprising:
    Hole Transport Layer (HTL) 150; and
  Upper electrode, Au 160.

Accordingly, the thin film of perovskite (PE) 140 semiconductor material is disposed between a pair of charge extracting layers, namely an upper charge extracting structure comprising a hole transporting layer (HTL) 150 and a lower charge extracting structure comprising an electron transporting layer (ETL) with a Semiconductor Material 130 layer, such as mesoporous $TiO_2$ (MP-$TiO_2$) which provides an n-type semiconductor material, disposed between the ETL 120 and PE 140.

According to different designs for the PSC 100 the ETL 120 materials may, for example, be titanium dioxide ($TiO_2$), tin oxide ($SnO_2$) or [6,6]-phenyl-C61-butyric acid methyl ester (PCBM).

According to different designs for the PSC 100 and the HTL 150 may, for example, be 2,2',7,7'-Tetrakis-(N,N-di-4-methoxyphenylamino)-9,9'-spirobifluorene (Spiro-MeOTAD), copper (1) thiocyanate (CuSCN), and poly(3,4-ethylenedioxythiophene):polystyrene sulfonate (PEDOT:PSS).

Optionally, the FTO 110, i.e., Fluorine doped Tin Oxide coated glass, may be replaced with indium tin oxide (ITO) coated glass, aluminum doped zinc oxide (AZO) coated glass or a glass with a transparent coating. Optionally, the glass may be replaced with a polymeric material (i.e., plastic) providing a flexible substrate.

For example, using $TiO_2$ and Spiro-MeOTAD charge extractors with 500 nm of OIHP treated with a mixture of chlorobenzene to ethanol, a maximum power conversion efficiency (PCE) of approximately 21% and fill factor (FF) of approximately 73% was reported within WO/2020/248, 063 for exemplary 3D PSCs 100 using copper (1) thiocyanate (CuSCN) as the HTL 150.

Figure 2:
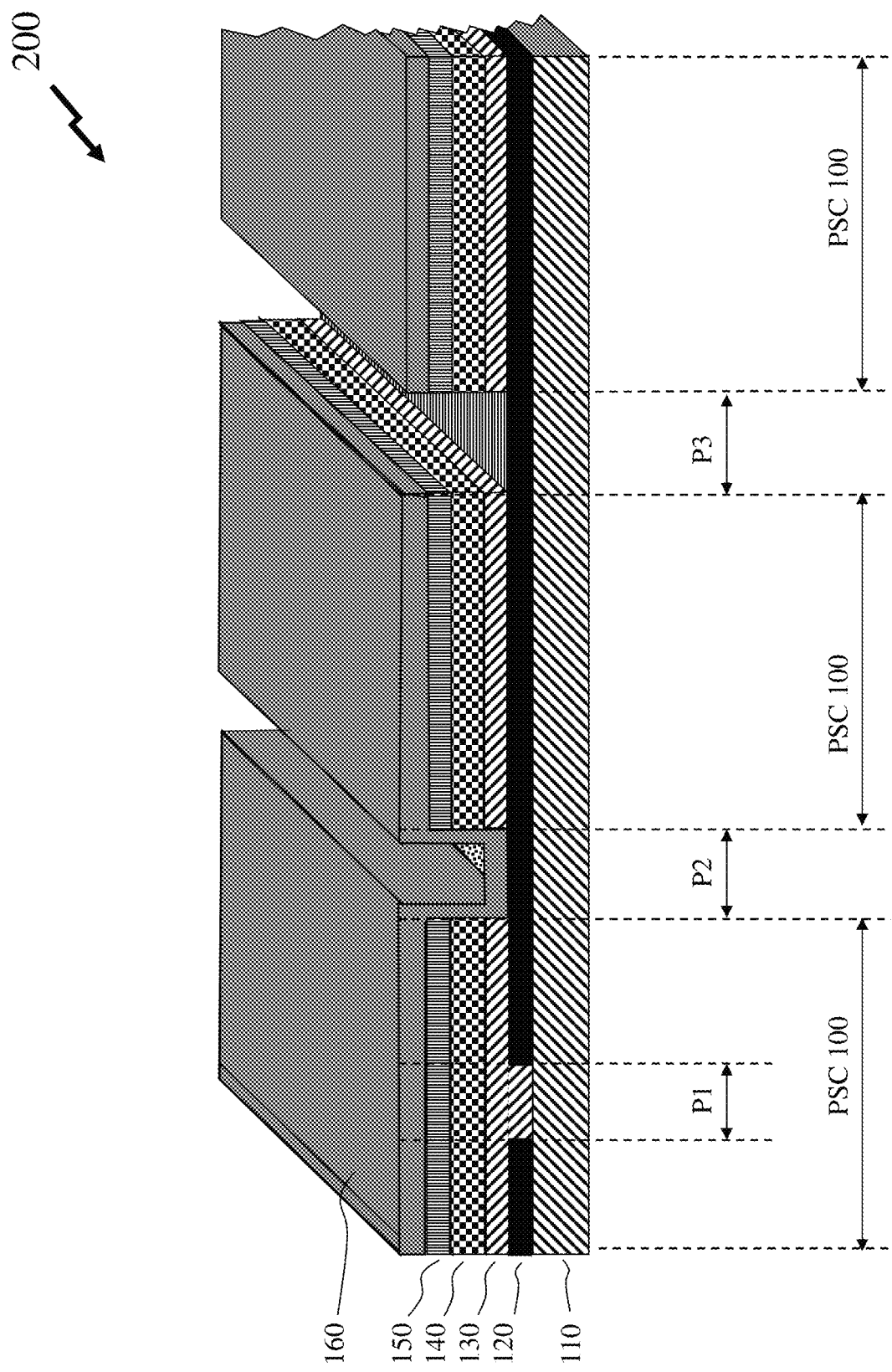
FIG. 2 depicts a schematic of a monolithically integrated perovskite based solar cell with scribing regions identified to electrically isolated adjacent cells using a solar cell construction according to FIG. 1 and as may be processed by systems according to embodiments of the invention.

Now referring to FIG. 2, there is depicted a schematic of a monolithically integrated perovskite solar cell (MI-PSC) 200 with scribing regions identified to electrically isolated adjacent cells. The MI-PSC 200 employing a perovskite solar cell construction such as PSC 100 depicted in FIG. 1 and as may be processed by systems according to embodiments of the invention. The MI-PSC 200 as depicted in FIG. 2 is constructed using a single row of PSC 100 unit cells. However, the MI-PSC 200 may contain a uniform or non-uniform two-dimensional (or three-dimensional) array of PSC 100 unit cells within other embodiments of the invention.

Whilst the PSC 100 and MI-PSC 200 exploit doped mixed cation perovskite materials for the capture of optical radiation and the generation of electricity it would be evident that the PSC 100 may be formed from another photovoltaic solar cell material system and/or design without departing from the scope of the invention. Further, the MI-PSC 200 may employ one or more other only photovoltaic solar cell material systems and/or designs discretely or in combination with doped mixed cation perovskite materials and/or doped mixed cation perovskite solar cell designs without departing from the scope of the invention. Such alternate photovoltaic solar cells may exploit, for example, hydrogenated amorphous and microcrystalline silicon (e.g., a-Si:H/μc-Si:H tandem structures), polycrystalline compounds such as Cu(Inx,Ga1-x) (Sey,S1-y)2 (e.g., CIGSe, and CdTe) for example, gallium arsenide (GaAs). Germanium (Ge), gallium indium phosphide (GaInP), kesterites, perovskites, and intermediate band photovoltaics for example, PSCs may also comprise multijunction cells employing, in essence, multiple solar cells formed on top of one another.

Structuring the module into a number of cells is necessary in order to lower the current and to increase the voltage. This structuring involves the complete and selective generation of very fine lines within the thin-film layers to form serial interconnections between the front and back contact while electrically isolating the individual solar cells. As depicted in FIG. 2 three scribing steps P1, P2, and P3 alternating with layer deposition are necessary to separate the solar cells and to perform so-called monolithic interconnection. Typically, in industrial production of solar cell modules these three scribing processes are performed by nanosecond laser or picosecond laser sources, in some instances at different wavelengths due to the properties of the material being ablated. Picosecond lasers, whilst more expensive than nanosecond lasers, are preferred in some instances due to the ability to ablate material without producing head affected edge zones.

Within the prior art laser ablation for scribing is preferred over mechanical scribing as it is perceived to offer higher precision and less area losses due to narrower scribes. However, the cost of picosecond lasers is high and they are subject to downtown and replacement with time. Further concurrent parallel processing is limited due to the output power of the lasers and the required energies for ablation.

In each of the scribing steps P1, P2 and P3 the goal is a narrow scribe line, no or minimal damage to underlying layers whilst removing one or more other layers, high production speed, and flexibility of processing. In order to achieve this the inventors have established new mechanical scribing tool designs which allow for these goals to be achieved. Beneficially, the new mechanical scribing tool designs and techniques according to embodiments of the invention also provide options for integrated determination of tool position within the PSC stack and concurrent multiple parallel tool use in conjunction with computer numerical control (CNC) handling and/or robotic handling systems for automated processing, etc.

Figure 3:
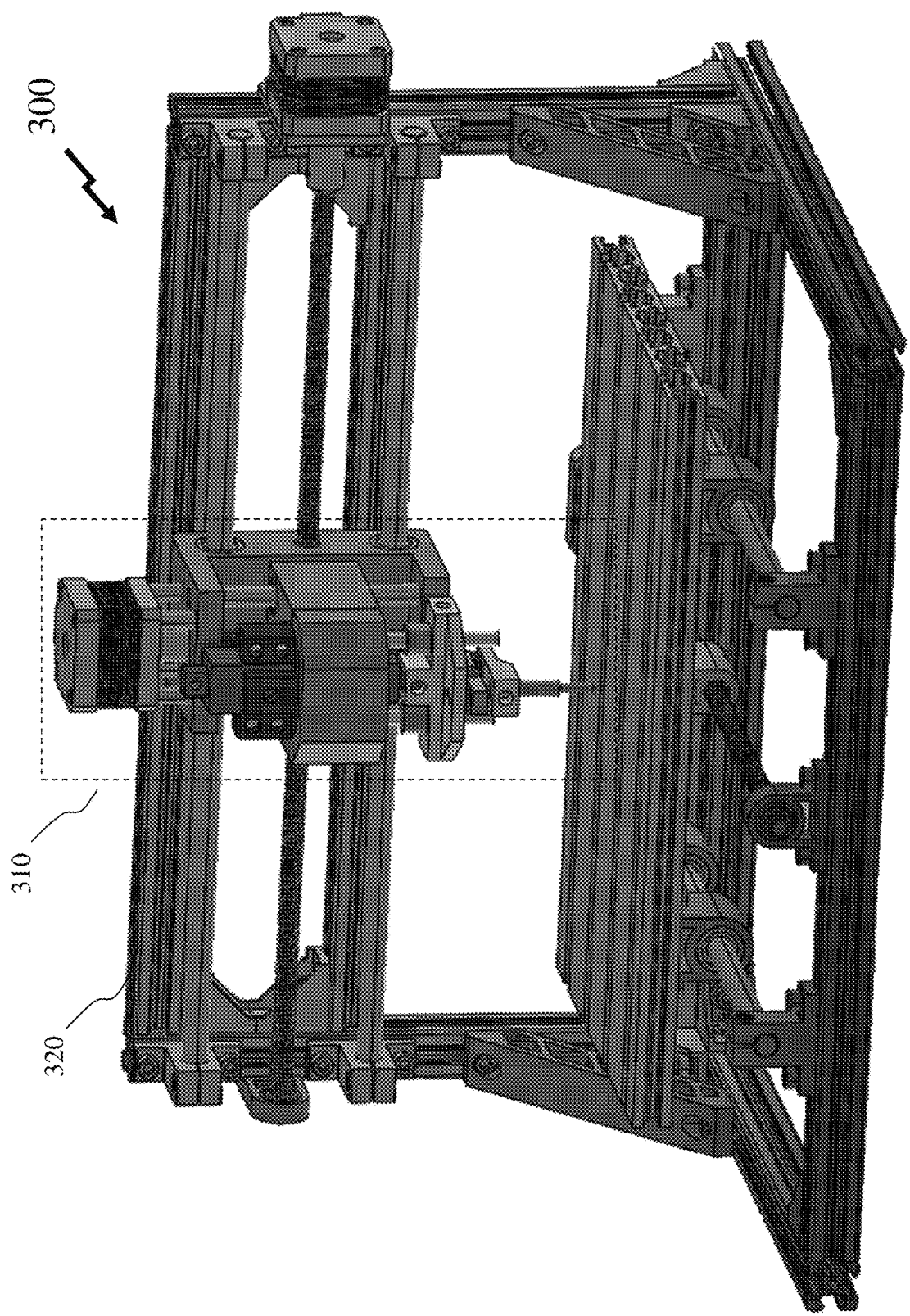
FIGS. 3-5 depict an exemplary scribing system according to an embodiment of the invention mounted to a computer numerical control (CNC) system.

FIG. 3 depicts an exemplary scribing system 300 comprising a Scribing Assembly 310 according to an embodiment of the invention mounted to a computer numerical control (CNC) System 320. The CNC System 320 provides movement of a substrate and/or movement of the Scribing Assembly 310 concurrently or independently of each other. Alternatively, the Scribing Assembly 310 may be attached to a robotic system allowing the Scribing Assembly 310 to be moved and positioned with respect to two-dimensional (2D) and/or three-dimensional (3D) solar cell arrays (SCAs).

Figure 4:
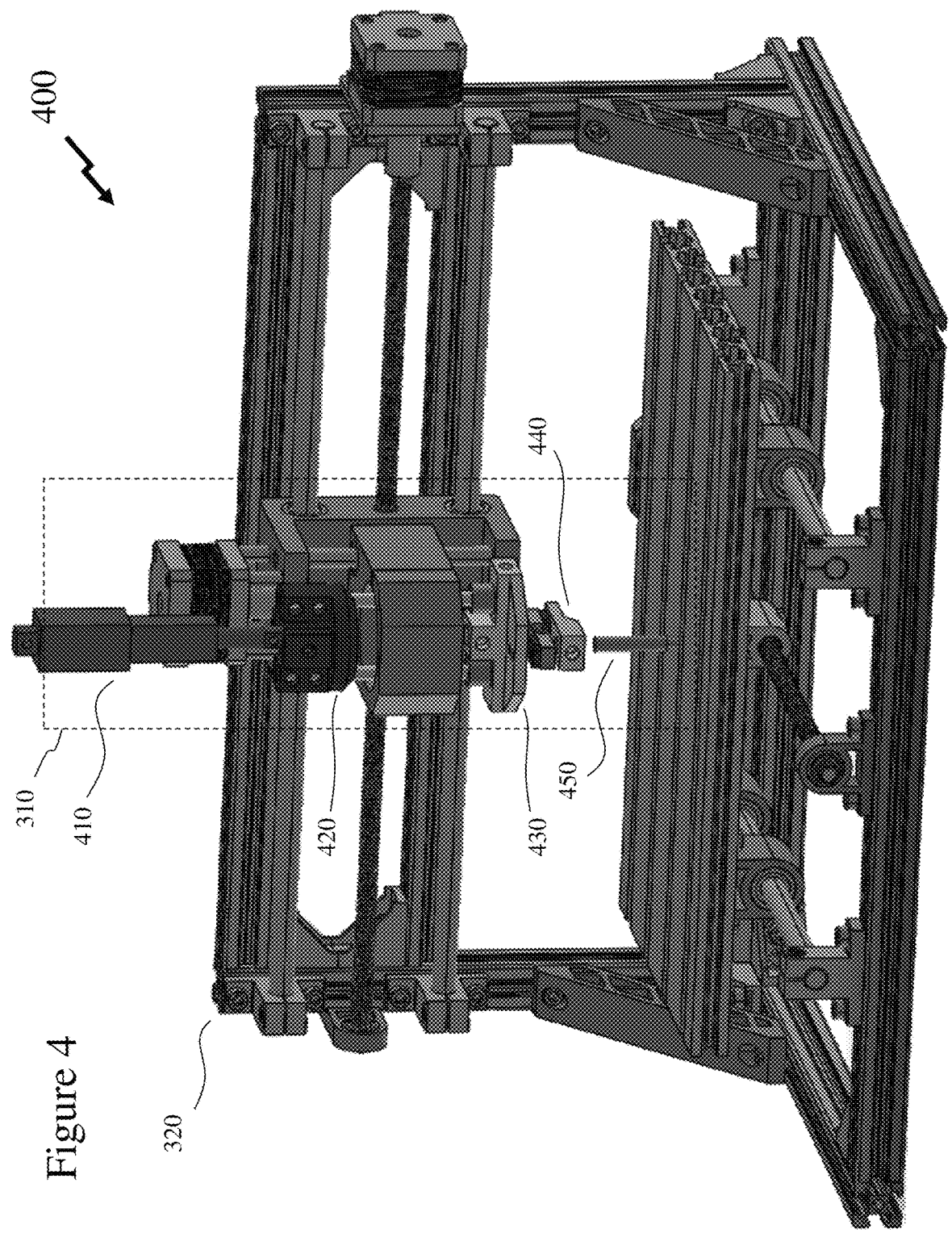

Now referring to FIG. 4 within exemplary scribing system 400 the Scribing Assembly 310 according to an embodiment of the invention is depicted in exploded form with respect to the CNC system 320. As depicted the Scribing Assembly 310 comprises:

Actuator 410;
Actuator Support 420;
Load Cell Support 430;
Load Cell 440; and
Scribe 450.

Figure 5:
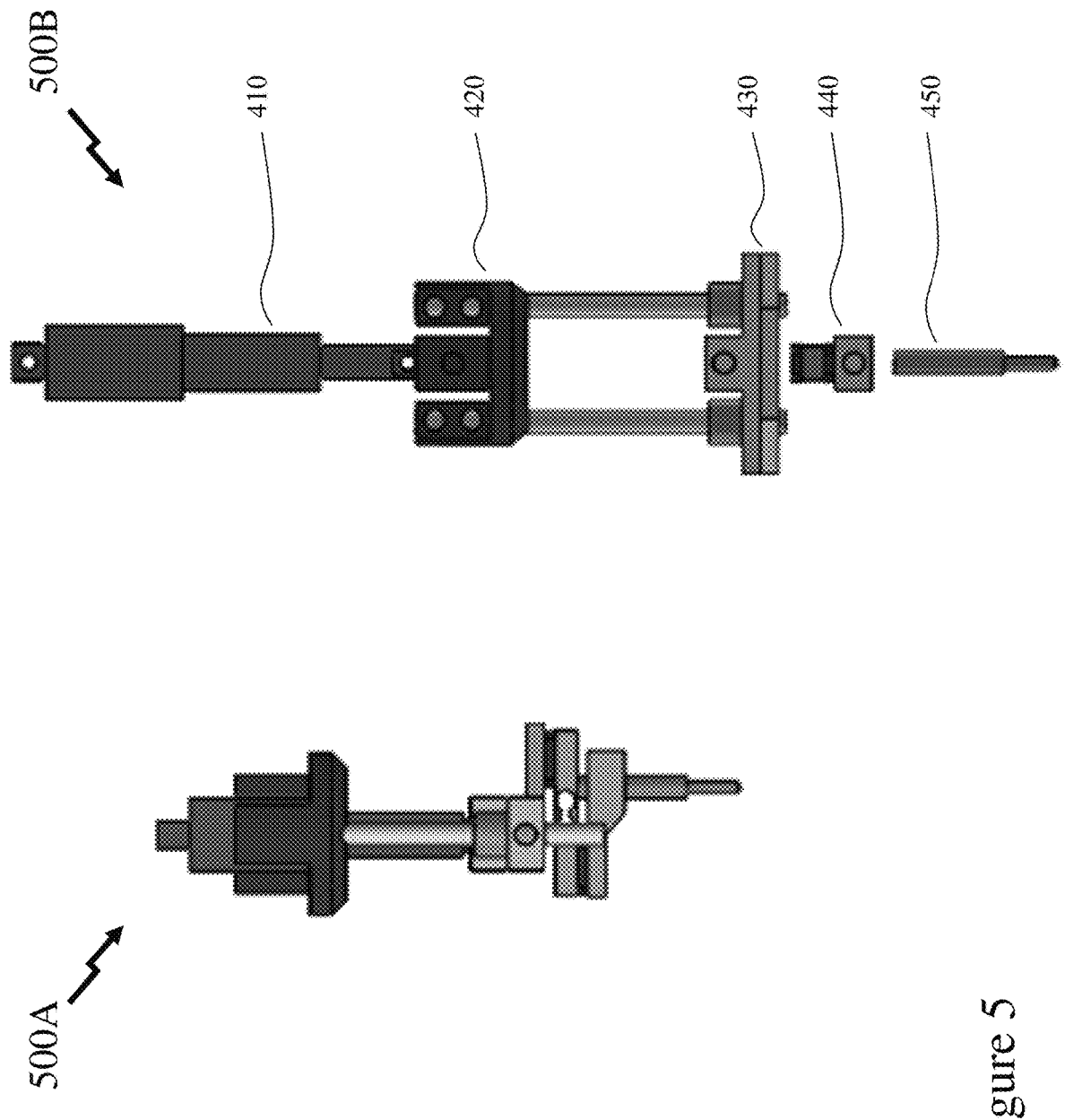

FIG. 5 depicts a scribing system according to an embodiment of the invention in isolation in first image 500A and in exploded assembly form in second image 500B. The Scribe 450 may for example be a drag bit formed from carbon tungsten although it would be evident that the Scribe 450 may be formed from other materials or employ a tip of another material for scribing the one or more materials within the solar cell for the scribing process being performed at that point. Optionally, a single Scribe 450 may be employed for all scribing processes or a different Scribe 450 may be employed for different subsets of scribing processes of the set of scribing processes required forming an isolated solar cell or a MI-PSC.

The Scribe 450 is mounted to a Load Cell 440. The tip of the Scribe 450 may be spring loaded to enhance control of the force applied to the solar cell during the scribing process. Optionally, the Scribe 450 may be attached to the Load Cell 440 via a spring to enhance control of the force applied to the solar cell during the scribing process. The use of a spring or springs allows for the tip of the Scriber 450 to maintain contact with the solar cell during the scribing process.

The Load Cell 440 is connected to a microcontroller allowing the microcontroller to read the force applied to the solar cell during the scribing process for quality assurance and/or feedback control of the scribing process.

The Load Cell 440 and Scriber 450 are mounted to the Actuator 410 via Load Cell Support 430. Whilst the Actuator 410 may be employed as is within embodiments of the invention the inventors have shown in FIGS. 3-5 an Actuator Support 420 which is a linear guide rail so that axial force on the Load Cell 440 and the Scriber 450 are reduced during their motion under the action of the Actuator 410. The Actuator 410 is coupled to the microcontroller to receive control instructions relating to the motion of the Actuator 410 shaft and therein the Load Cell 440 and Scriber 450 relative to the solar cell. The microcontroller may also control the CNC system 320 to move the solar cell relative to the Scriber 450. Optionally, the Scriber 450/Load Cell 440 assembly may be directly mounted to a robotic system or mounted via an Actuator 410.

Optionally, within another embodiment of the invention the Load Cell 440 is mounted directly to the Actuator 410 or may integrated within the Actuator 410.

Within embodiments of the invention the tip of the Scriber 450 (or potentially the entire Scriber 450) may be electrically conductive, e.g. formed from a conductive ceramic, ceramic polymer, metal or alloy, so that as the tip of the Scriber 450 engages with the layer(s) being scribed the resistance (or resistivity or conductivity) between the tip of the Scriber 450 and the solar cell being scribed can be measured. As the different layers of the PSC 100 and MI-PSC 200 have different electrical characteristics then these electrical measurements can be employed to ensure that the tip of the Scriber 450 is in contact with the appropriate layer of the device prior to the scribing process being initiated and the variations in the electrical measurements employed to ensure that the desired layer(s) are being scribed.

Figure 6:
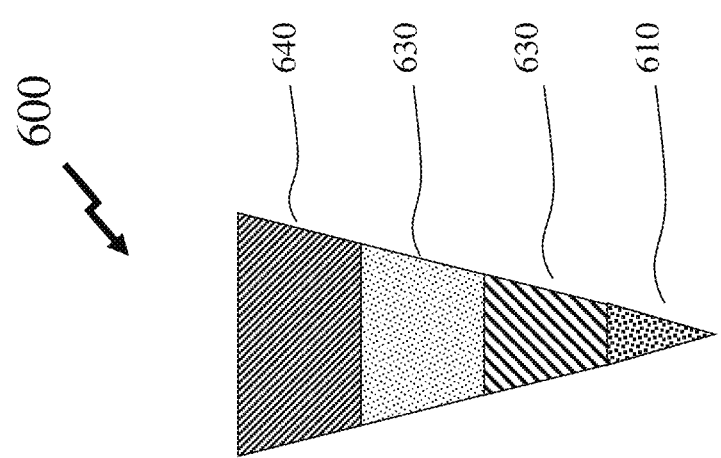
FIG. 6 depicts an exemplary tip of scriber according to an embodiment of the invention.

Optionally, the tip of the Scriber 450 may have multiple electrical contacts formed upon it or be formed from multiple conductive layers electrically isolated so that additional electrical data can be extracted from the scribing process. An exemplary schematic of a multi-contact tip (MCT) 600 being depicted in FIG. 6 comprising:

First Element 610;
First Spacer 620;
Second Element 630; and
Second Spacer 640.

First Element 610 and Second Element 630 being conductive and coupled via electrical connections (not depicted for clarity) within the tip of the Scriber 650 and Scriber 650 to the remote microcontroller. The First Spacer 620 and Second Spacer 630 being insulating. The thickness and dimensions of these layers being defined in dependence of the scribing process and the device being scribed but could be sub-micron thick, a micro thick, a few microns thick etc.

The scriber and substrate of the devices upon which the scribing is being performed may be electrically connected to an electrical measurement system which provides electrical data to the microcontroller. The scriber and an electrical contact of the device(s) upon which the scribing is being performed may be electrically connected to an electrical measurement system which provides electrical data to the microcontroller. Optionally, multiple electrical contacts may be provided and an appropriate electrical contact of the multiple electrical contacts employed during the scribing of a particular portion of the device, array of devices or substrate.

Optionally, the tip of the scriber may be insulating and the electrical measurements taken from other layers.

Optionally, electrical measurements can be employed to determine a condition of the scriber tip during use.

Optionally, a region of the device may have a layer to be scribed to exposed allowing a baseline electrical measurement to be established for the layer prior to the scriber tip penetrating other layers to perform the scribing process.

The tip of the scriber may at manufacture have a defined geometry, e.g., pyramidal, hemi-spherical etc. Optionally, the tip of the scriber may have a three-dimensional regular polyhedral geometry, a three-dimensional irregular polyhedral geometry or an arbitrary geometry.

Figure 7:
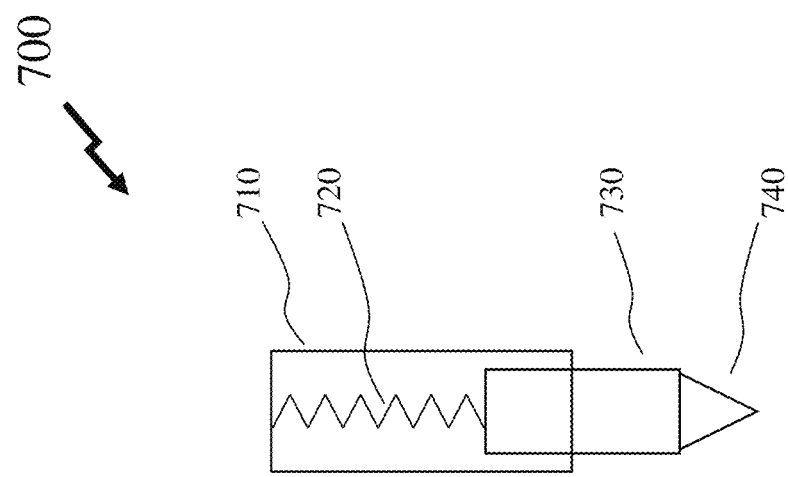
FIG. 7 depicts a schematic of a scribing tip according to an embodiment of the invention.

Referring to FIG. 7 there is depicted a cross-section of a Scribing Tip 700 according to an embodiment of the invention. As depicted the Scribing Tip 700 comprises a Body 710 which retains a Tip Element 730 which has a Tip 740 attached or integral to the Tip Element 730. The Tip Element 730 being coupled to the Body 710 via Spring 720. Tip 740 may be silicon carbide, diamond, or another material or combination of materials or a tip such as described and depicted with respect to FIG. 6.

Referring to FIG. 8, there is depicted an exemplary schematic with respect to the forces and scribing of sequential layers or different layers within the stack of the PSC. As depicted, there is a Substrate 810, a first Layer 820 and a second Layer 830. Through appropriate selection of the materials for the first Layer 820 and second Layer 830 then second Layer 820 has an increased hardness than the first Layer 810. The force required therefore to be applied to scribe the first Layer 810 is greater than to scribe the second Layer 820. For example, the first Layer 810 may require a minimum of 350 grams of force applied on the surface to be able to scribe all the way through whilst for the second Layer 820, only 150 grams of force is required. By applying a force between 150 grams and 350 grams, the second Layer 820 can be scribed without scribing the first Layer 810 when scribing through first Layer 820 and second Layer 830 in different scribing steps.

As outlined above, the different materials within the different layers of the stack of the PSC have different electrical resistivity. Accordingly, referring to FIG. 9 with scribing through first Layer 820 and second Layer 830 in different scribing steps electrical measurements can be employed to control the scribing method and to establish the depth of the scribe. Accordingly, if we consider a scenario that the second Layer 830 is formed from a material which has an electrical resistivity of 350 ohms and the first Layer 820 of 50 ohms then when the scriber is still in the depth of the second layer, the electrical resistivity is 350 ohms, but when scribes past the second Layer 820 into the first Layer 810, the electrical resistivity is 50 ohms. Accordingly, this measurement can be used to control the depth of the scribing tool.

Figure 10:
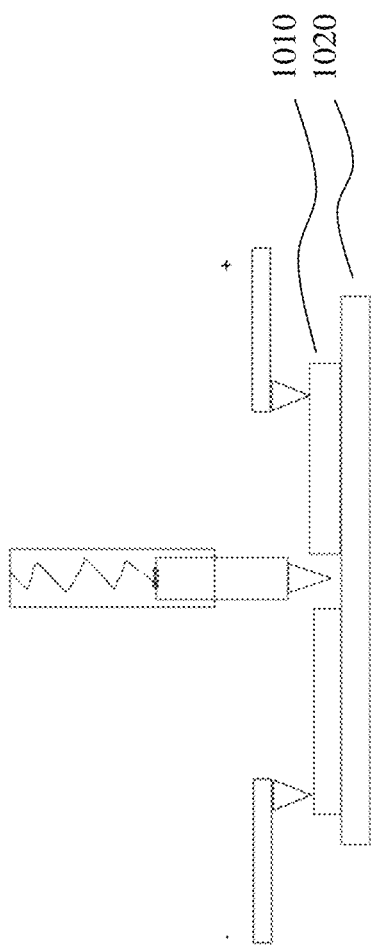
Figure 11:
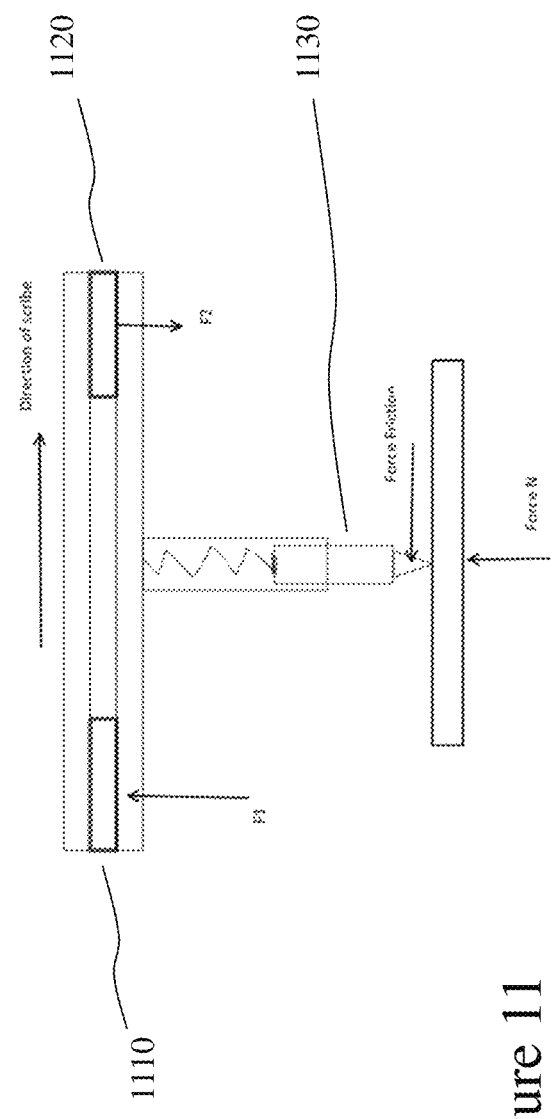
FIG. 11 depicts a schematic of force monitoring with systems and scribing tips according to embodiments of the invention.

Within FIG. 9 the electrical measurements are made between the scriber tip and the layer being scribed. However, as depicted in FIG. 10 electrical measurements can also be made within a layer to define other aspects of the scribing process, such as progress along the scribe and completion of the scribe. For example, if Layer 1010 has a resistivity of 30 ohms, then when the scribing tool has gone through all of the scribe length to isolate the left hand side from the right hand side the resistance between them will increase to that defined by the Substrate 1020. However, during the scribing process the resistance measured will increase as the scribing process proceeds allowing it to be monitored for progress as well as depth via the tip as described in respect of FIG. 9.

Within the description of the scribing system in respect of FIGS. 3 to 5 a load cell has been described as disposed between the scribing tip and the actuator(s) moving the scribing tip relative to the PSC being scribed. Within embodiments of the invention multiple force sensors may be employed in the load cell allowing an improved characterisation of the force applied on the surface of the PSC being scribed. A first Load Sensor 1110 and a second Load Sensor 1120 are depicted, these being behind and ahead of the Scribing Tip 1130 as it moves relative to the PSC or the PSC is moved relative to Scribing Tip 1130. The force normal to the surface of the PSC is equal to F1, the force registered by first Load Sensor 1110, minus F2, the force registered by the second Load Sensor 1120. The difference in these forces arising from the friction between the Scribing Tip 1130 and the surface of the PSC. Accordingly, with the readings from both of these force sensors the resistance force on the surface of the PSC can be calculated yielding information on the material being scribed.

Figure 12:
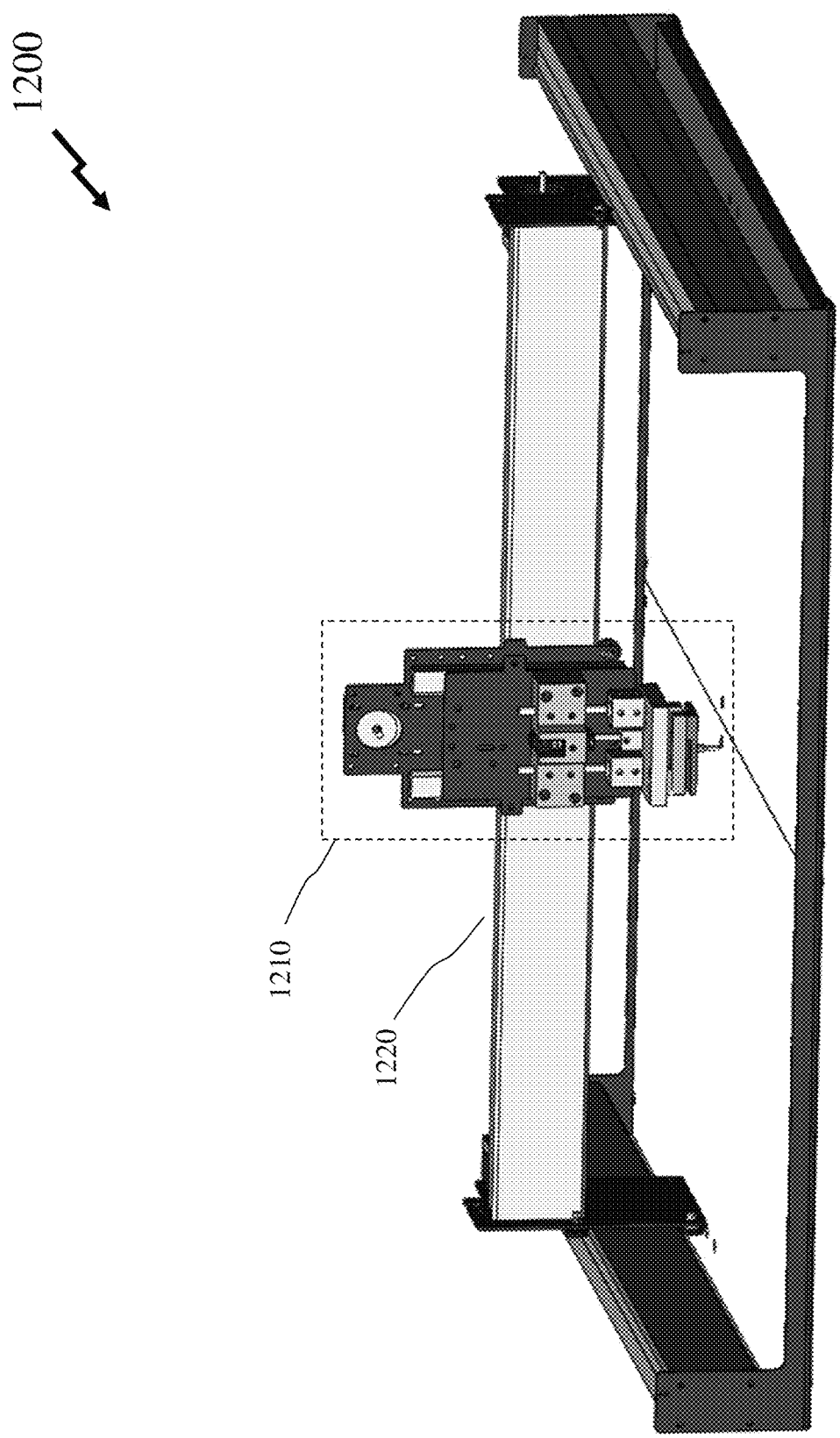
FIGS. 12 to 14 depict an exemplary scribing system according to an embodiment of the invention mounted to a computer numerical control (CNC) system.

Now referring to FIG. 12 there is depicted an exemplary scribing system 1200 comprising a Scribing Assembly 1210 according to an embodiment of the invention mounted to a computer numerical control (CNC) System 1220. The CNC System 1220 provides movement of a substrate and/or movement of the Scribing Assembly 1210 concurrently or independently of each other. Alternatively, the Scribing Assembly 1210 may be attached to a robotic system allowing the Scribing Assembly 1210 to be moved and positioned with respect to two-dimensional (2D) and/or three-dimensional (3D) solar cell arrays (SCAs).

Figure 13:
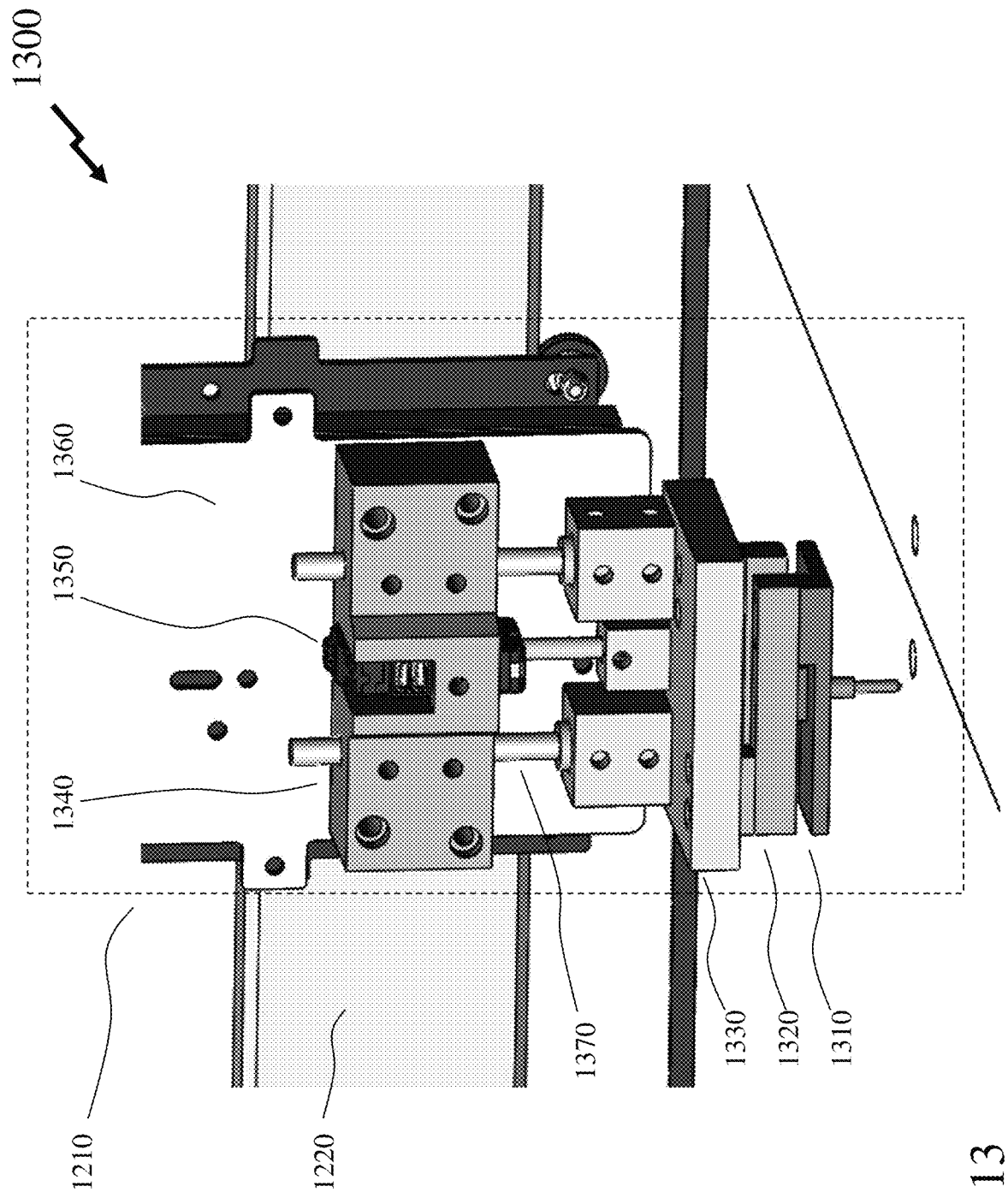

Now referring to FIG. 13 within exemplary scribing system 1300 the Scribing Assembly 1210 according to an embodiment of the invention is depicted in detail respect to the CNC system 1220. As depicted the Scribing Assembly 1210 comprises:

Scribe Assembly 1310;
Load Cell 1320;
Load Cell Support 1330;
Support 1340;
Actuator 1350;
Assembly Support 1360; and
Linear Guide 1370.

The Assembly Support 1360 enables mounting of the Scribing Assembly 1210 to the CNC System 1220 whilst the Support 1340 mounts the Actuator 1350 to the Assembly Support 1360. The Actuator 1350 moves Load Cell Support 1330, Load Cell 1320 and the Scribe Assembly 1310 (which includes the scribing tip) vertically relative to the surface of the PSC being scribed. Linear Guides 1370 reduce lateral motion of the Load Cell Support 1330, Load Cell 1320 and the Scribe Assembly 1310 under the action of the Actuator 1350.

Figure 14:
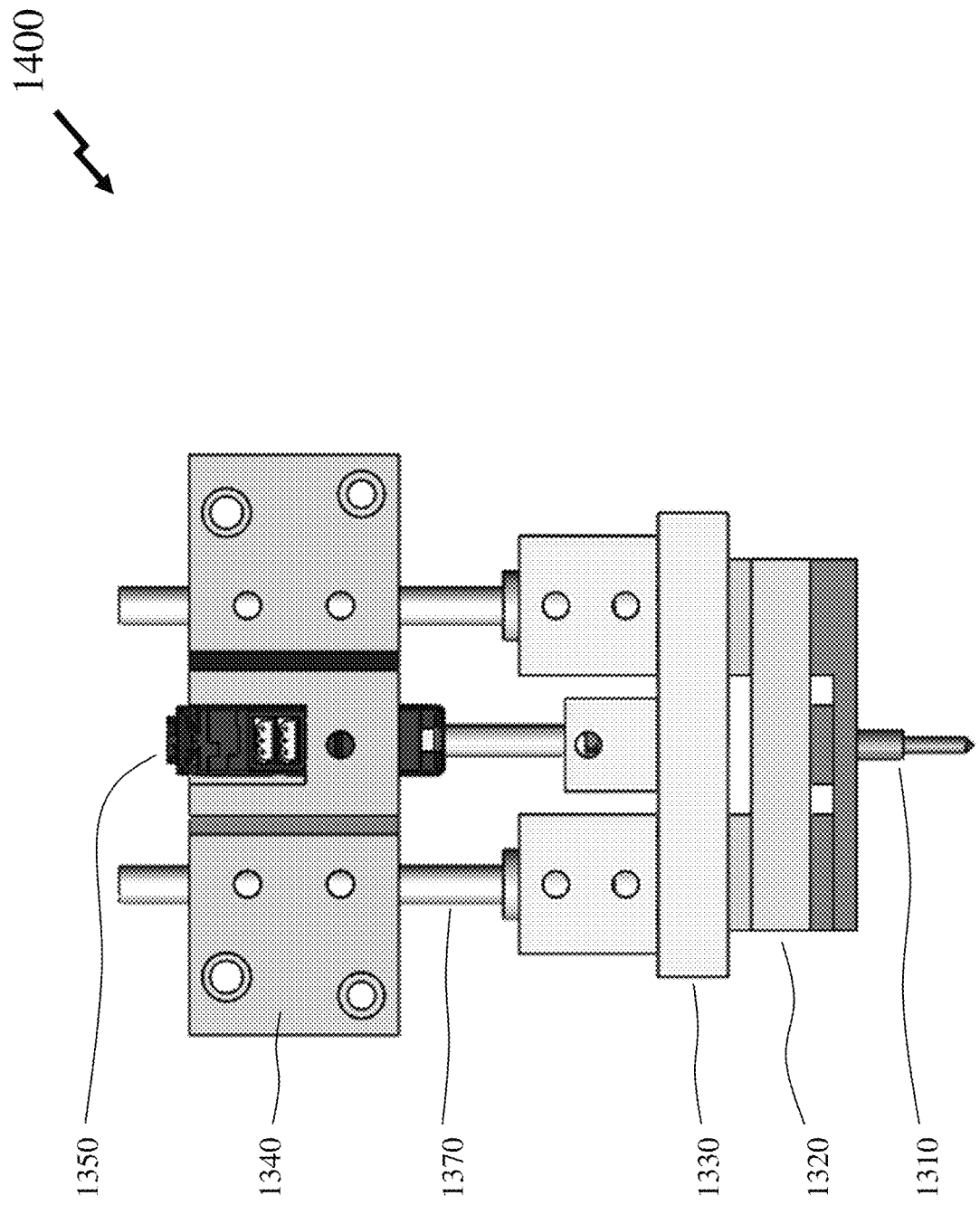

FIG. 14 depicts elements of the Scribing Assembly 1210 in isolation. These being:

Scribe Assembly 1310;
Load Cell 1320;
Load Cell Support 1330;
Support 1340;
Actuator 1350; and
Linear Guide 1370.

Figure 15:
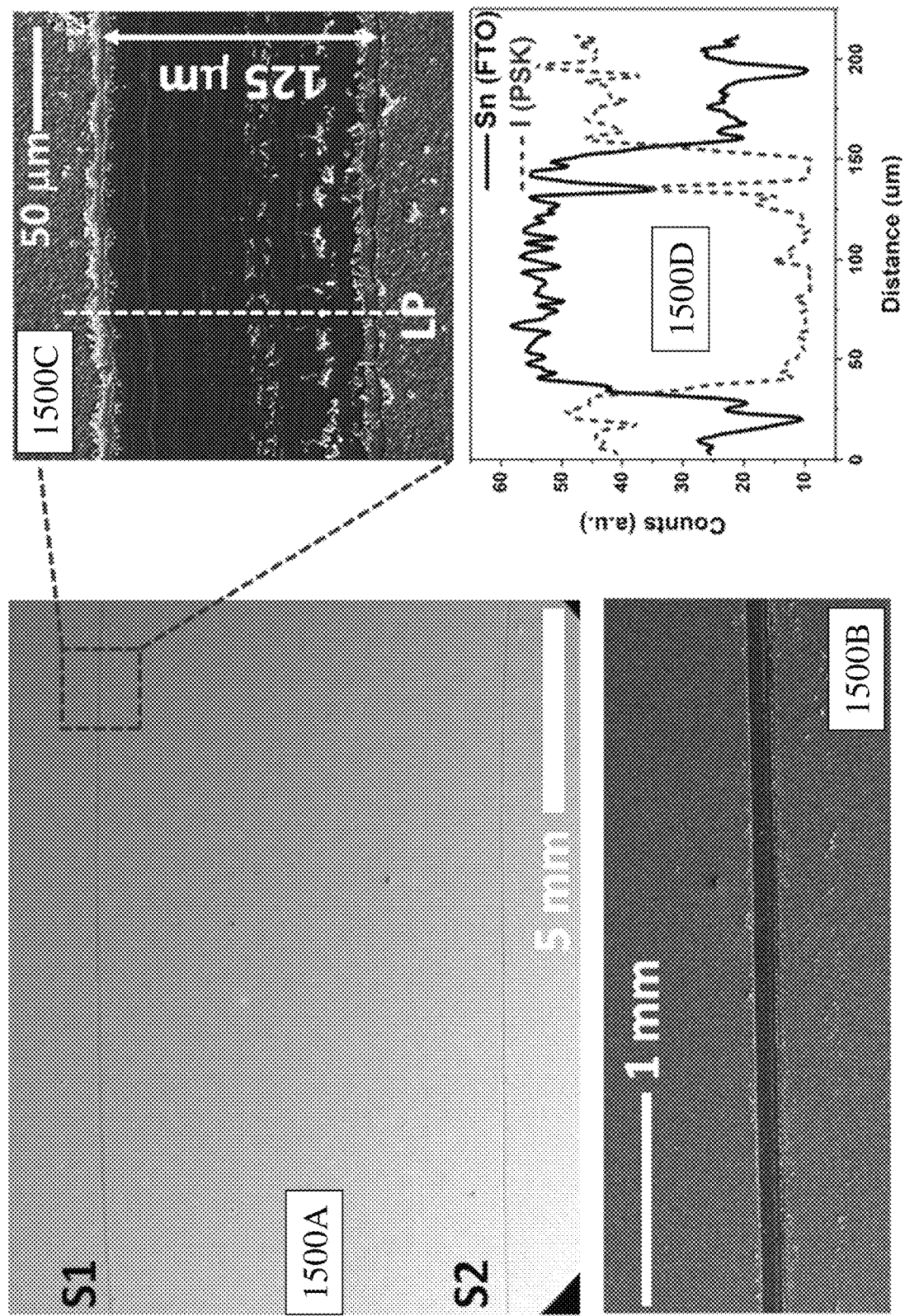
FIG. 15 depicts scribed lines formed using a scribing system according to an embodiment of the invention.

Referring to FIG. 15 there are depicted first to fourth Images 1500A to 1500D respectively of scribing lines formed with a scribing system according to an embodiment of the invention. Accordingly, there is depicted:

First Image 1500A depicts a pair of scribe lines S1 and S2 formed upon a PSC;
Second Image 1500B and 1500C depict magnified images of the scribe line S2;

Fourth Image 1500D depicts energy-dispersive X-ray spectroscopy results from scanning electron microscopy imaging of the scribe line S2 showing the removal of an iodine perovskite (PSK) layer (reduction in counts within the scribed region of iodine (I)) exposing the underlying fluorine-doped tin oxide (increase of counts within the scribed region of tin (Sn)).

Accordingly, a wide range of thin film devices such as optical displays, light emitters, photodiodes, and solar cells patterned on substrates as thin films can be electrically isolated when arrays are formed and/or be mechanically separated for packaging. With solar cells particularly and the development of thin film processes based upon perovskite inks, see WO/2020/248,063 for example, then large area substrates can be implemented. Further, such perovskite inks and their low temperature processing allows them to employ low temperature flexible and/or conformal substrates such as polymeric substrates for example.

Accordingly, exemplary embodiments of the invention address the requirement for electrical isolating and/or mechanically isolating thin film devices with different physical layer structures, different geometries etc. on a wide range of substrates.

Accordingly, the inventors have established a system comprising a scriber comprising a tip, a load cell to which the scriber is attached, an actuator for moving the load cell and scriber relative to a surface of a substrate and a positioning system to which the actuator is attached. The actuator and positioning system position the tip of the scriber with respect to a set of layers formed upon a substrate, the actuator positions the tip of the scriber into contact with a defined layer of the set of layers, and the positioning system moves the substrate in order to scribe one or more layers of the stack of layers above the defined layer within which the tip of the scriber is in contact with.

Further, the system comprises a microcontroller coupled to the actuator, the positioning system and an electrical measurement system where the electrical measurement system is coupled to the scriber and an electrical contact forming part of the substrate and the tip of the scriber is electrically conductive. The microcontroller determines that the tip of the scriber is in contact with the defined layer of the set of layers in dependence upon electrical data from the electrical measurement system.

Further, the system comprises a microcontroller coupled to the actuator, the positioning system and an electrical measurement system where the electrical measurement system is coupled to the tip of the scriber and an electrical contact forming part of the substrate and the tip of the scriber comprises two or more electrically conductive elements where each contact contacts a different layer of the set of layers when the tip of the scriber is in contact with the defined layer of the set of layers. The microcontroller determines that the tip of the scriber is in contact with the defined layer of the set of layers in dependence upon electrical data from the electrical measurement system established in dependence.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method of fabricating a photovoltaic device comprising:

providing a structure comprising a substrate, a set of layers on one side of the substrate comprising a semiconductor material, an upper electrical contact to the semiconductor material, a lower electrical contact to the semiconductor material and an electrical contact to the substrate; and scribing a set of scribe lines; wherein each scribe line of the set of scribe lines is formed within a defined subset of the set of layers;

the set of scribe lines generate a series of electrically isolated adjacent photovoltaic cells upon the substate which are subsequently electrically connected in a predetermined configuration through a subsequent manufacturing process to form the photovoltaic device;

the scribing of the set of scribe lines is performed with a scribing system comprising:

a scriber comprising a tip;

a load cell to which the scriber is attached;

an actuator for moving the load cell and scriber relative to a surface of a substrate;

a positioning system to which the actuator is attached;

a microcontroller coupled to the actuator, the positioning system and an electrical measurement system; and the electrical measurement system which is coupled to the tip of scriber and the electrical contact to the substrate;

the actuator and positioning system position the tip of the scriber with respect to the set of layers formed upon the substrate;

the actuator positions the tip of the scriber into contact with a defined layer of the set of layers;

the positioning system moves the substrate in order to scribe one or more layers of the stack of layers above the defined layer within which the tip of the scriber is in contact with;

the tip of the scriber comprises two or more electrically conductive elements where each electrically conductive element of the two or more electrically conductive elements contacts a different layer of the set of layers when the tip of the scriber is in contact with a defined layer of the set of layers; and the microcontroller determines that the tip of the scriber is in contact with the defined layer of the set of layers in dependence upon electrical data from the electrical measurement system for the two or more electrical contacts of the tip of the scriber.

2. The method according to claim 1, further comprising selecting the materials for each layer of the set of layers; wherein
a force to be applied to scribe the lowermost layer of the set of layers is less than that required to scribe the substrate; and
the force to be applied to each subsequent layer of the set of layers is less than that required to scribe the layers below it such that each scribe line of the set of scribe lines scribes down to a defined layer of the set of layers.

3. The method according to claim 1, further comprising selecting the materials for each layer of the set of layers; wherein
a force to be applied to scribe the lowermost layer of the set of layers is less than that required to scribe the substrate; and
the force to be applied to each subsequent layer of the set of layers is less than that required to scribe the layers below it such that each scribe line of the set of scribe lines scribes down to a defined layer of the set of layers; and
the electrical resistivities of the set of layers allow unique identification of the layer of the set of layers the tip is in contact with by the microcontroller from the electrical data obtained from the electrical measurement system.

4. The method according to claim 1, further comprising selecting the materials for each layer of the set of layers; wherein
a force to be applied to scribe the lowermost layer of the set of layers is less than that required to scribe the substrate; and
the force to be applied to each subsequent layer of the set of layers is less than that required to scribe the layers below it such that each scribe line of the set of scribe lines scribes down to a defined layer of the set of layers; and
the electrical resistivities of the set of layers allow unique identification of the layer of the set of layers the tip is in contact with by the microcontroller from the electrical data obtained from the electrical measurement system.

5. The method according to claim 1, further comprising selecting the materials for each layer of the set of layers in dependence upon a force required to scribe said materials; wherein
a force required to scribe a subset of the set of layers providing the lower electrical contact is less than another force required to scribe the substrate;
a further force required to scribe another subset of the set of layers providing the semiconductor material is less than the force required to scribe the subset of the set of layers providing the lower electrical contact and less than the another force required to scribe the substrate;
a final force required to scribe a further subset of the set of layers providing the upper electrical contact is less than the further force required to scribe the another subset of the set of layers providing the semiconductor material, less than the force required to scribe subset of the set of layers providing the lower electrical contact and less than the another force required to scribe the substrate; and
each scribe line of the set of scribe lines is formed within a defined subset of the set of layers in dependence upon a force applied to the set of layers when scribing the scribe line of the set of scribe lines.

6. The method according to claim 1, further comprising selecting the materials for each layer of the set of layers in dependence upon a force required to scribe said materials; wherein
a force required to scribe a subset of the set of layers providing the lower electrical contact is less than another force required to scribe the substrate;
a further force required to scribe another subset of the set of layers providing the semiconductor material is less than the force required to scribe the subset of the set of layers providing the lower electrical contact and less than the another force required to scribe the substrate;
a final force required to scribe a further subset of the set of layers providing the upper electrical contact is less than the further force required to scribe the another subset of the set of layers providing the semiconductor material, less than the force required to scribe subset of the set of layers providing the lower electrical contact and less than the another force required to scribe the substrate; and
each scribe line of the set of scribe lines is formed within a defined subset of the set of layers in dependence upon a force applied to the set of layers when scribing the scribe line of the set of scribe lines such that the defined subset of the set of layers is either the further subset of the set of layers providing the upper electrical contact, the further subset of the set of layers providing the upper electrical contact and the another subset of the set of layers providing the semiconductor material or the set of layers.

7. A method of fabricating a photovoltaic device comprising:
providing a structure comprising a substrate, a set of layers on one side of the substrate comprising a semiconductor material, an upper electrical contact to the semiconductor material, a lower electrical contact to the semiconductor material and an electrical contact to the substrate; and
scribing a set of scribe lines; wherein
each scribe line of the set of scribe lines is formed within a defined subset of the set of layers;
the set of scribe lines generate a series of electrically isolated adjacent photovoltaic cells upon the substate which are subsequently electrically connected in a predetermined configuration through a subsequent manufacturing process to form the photovoltaic device;
the scribing of the set of scribe lines is performed with a scribing system comprising a:
a scriber comprising a tip;
an actuator for moving the scriber relative to a surface of a substrate;
a positioning system to which the actuator is attached;
a microcontroller coupled to the actuator, the positioning system and an electrical measurement system; and
the electrical measurement system which is coupled to the tip of scriber and the electrical contact to the substrate;
the actuator positions the tip of the scriber into contact with a defined layer of the set of layers;
the tip of the scriber comprises two or more electrically conductive elements where each electrically conductive element of the two or more electrically conductive elements contacts a different layer of the set of layers when the tip of the scriber is in contact with a defined layer of the set of layers; and
the microcontroller determines that the tip of the scriber is in contact with the defined layer of the set of layers in dependence upon electrical data from the electrical measurement system for the two or more electrical contacts of the tip of the scriber.

8. A method of fabricating a photovoltaic device comprising:
  providing a structure comprising a substrate, a set of layers on one side of the substrate comprising a semiconductor material, an upper electrical contact to the semiconductor material, a lower electrical contact to the semiconductor material and an electrical contact to the substrate; and
  scribing a scribe line within a defined subset of the set of layers;
  the scribe line generates a series of electrically isolated adjacent photovoltaic cells upon the substate which are subsequently electrically connected in a predetermined configuration through a subsequent manufacturing process to form the photovoltaic device;
  the scribing of the scribe line is performed with a scribing system comprising:
    a scriber comprising a tip;
    an actuator for moving the load cell and scriber relative to a surface of a substrate;
    a microcontroller coupled to the actuator and an electrical measurement system; and
    the electrical measurement system which is coupled to the tip of scriber and the electrical contact to the substrate;
  the actuator positions the tip of the scriber into contact with a defined layer of the set of layers;
  the tip of the scriber comprises two or more electrically conductive elements where each electrically conductive element of the two or more electrically conductive elements contacts a different layer of the set of layers when the tip of the scriber is in contact with a defined layer of the set of layers;
  the microcontroller determines that the tip of the scriber is in contact with the defined layer of the set of layers in dependence upon electrical data from the electrical measurement system for the two or more electrical contacts of the tip of the scriber; and
  the scribe line is scribed by moving the substrate relative to the scriber once it has been determined by the microcontroller that the tip of the scriber is in contact with the defined layer of the set of layers.

* * * * *